(12) United States Patent
Kwon et al.

(10) Patent No.: US 10,673,016 B2
(45) Date of Patent: Jun. 2, 2020

(54) DISPLAY DEVICE COMPRISING AN INORGANIC ENCAPSULATION LAYER COVERING A PIXEL AREA AND A PIXEL AREA GAP

(71) Applicant: Samsung Display Co., Ltd., Yongin-si, Gyeonggi-do (KR)

(72) Inventors: Oh June Kwon, Hwaseong-si (KR); Jin Koo Kang, Cheonan-si (KR); Chung Sock Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/926,984

(22) Filed: Mar. 20, 2018

(65) Prior Publication Data
US 2018/0212188 A1 Jul. 26, 2018

Related U.S. Application Data

(62) Division of application No. 14/645,285, filed on Mar. 11, 2015, now abandoned.

(30) Foreign Application Priority Data

Jul. 25, 2014 (KR) .................. 10-2014-0095100

(51) Int. Cl.
*H01L 51/52* (2006.01)
*H01L 51/00* (2006.01)
*H01L 27/32* (2006.01)

(52) U.S. Cl.
CPC ...... *H01L 51/5253* (2013.01); *H01L 27/3244* (2013.01); *H01L 51/0097* (2013.01)

(58) Field of Classification Search
CPC ............ H01L 51/5253; H01L 27/3244; H01L 51/0097
USPC ..................................................... 257/40, 59
See application file for complete search history.

(56) References Cited

U.S. PATENT DOCUMENTS

| 8,664,649 | B2 | 3/2014 | Lee |
| 2004/0192082 | A1 | 9/2004 | Wagner et al. |
| 2004/0201027 | A1* | 10/2004 | Ghosh ................ H01L 51/5253 257/99 |
| 2004/0232832 | A1 | 11/2004 | Kubota |
| 2005/0212419 | A1 | 9/2005 | Vazan et al. |
| 2007/0114521 | A1 | 5/2007 | Hayashi et al. |
| 2007/0194711 | A1 | 8/2007 | Matsuura et al. |
| 2010/0181903 | A1 | 7/2010 | Kim et al. |
| 2010/0244073 | A1 | 9/2010 | Ito et al. |
| 2011/0132449 | A1 | 6/2011 | Ramadas et al. |

(Continued)

FOREIGN PATENT DOCUMENTS

| JP | 3163551 B2 | 3/2001 |
| KR | 1998-067060 A | 10/1998 |

*Primary Examiner* — Lex H Malsawma
*Assistant Examiner* — Eric W Jones
(74) *Attorney, Agent, or Firm* — Lewis Roca Rothgerber Christie LLP (57) ABSTRACT

A display device includes: a substrate; a plurality of pixels on the substrate; an organic encapsulation layer covering a pixel area including at least one pixel; a first inorganic encapsulation layer on the organic encapsulation layer and having a first crack at a pixel area gap; and a second inorganic encapsulation layer on the first inorganic encapsulation layer and filling the first crack.

17 Claims, 11 Drawing Sheets

(56) References Cited

U.S. PATENT DOCUMENTS

| | | |
|---|---|---|
| 2011/0140163 A1 | 6/2011 | Oh et al. |
| 2011/0151200 A1 | 6/2011 | Erlat et al. |
| 2011/0260201 A1* | 10/2011 | Klein .................. H01L 51/0097 257/99 |
| 2012/0091477 A1 | 4/2012 | Kim |
| 2012/0146492 A1 | 6/2012 | Ryu et al. |
| 2012/0235207 A1 | 9/2012 | Kwack et al. |
| 2014/0021856 A1 | 1/2014 | Jung et al. |
| 2014/0034994 A1 | 2/2014 | Yamane et al. |
| 2014/0126228 A1* | 5/2014 | Lee ...................... H05K 5/0017 362/382 |
| 2014/0138641 A1 | 5/2014 | Yi |
| 2014/0159026 A1* | 6/2014 | Okumoto .............. H01L 29/786 257/40 |
| 2014/0218872 A1 | 8/2014 | Park et al. |

* cited by examiner

DISPLAY DEVICE COMPRISING AN INORGANIC ENCAPSULATION LAYER COVERING A PIXEL AREA AND A PIXEL AREA GAP

CROSS-REFERENCE TO RELATED APPLICATION

This application is a divisional of U.S. patent application Ser. No. 14/645,285, filed Mar. 11, 2015, which claims priority to and the benefit of Korean Patent Application No. 10-2014-0095100, filed Jul. 25, 2014, the entire content of both of which is incorporated herein by reference.

BACKGROUND

1. Field

The described technology relates to a display device and a manufacturing method thereof. More particularly, the described technology relates to a flexible and stretchable display device.

2. Description of the Related Art

An organic light emitting diode (OLED) display is a self-emissive display device that displays images with organic light emitting diodes. The organic light emitting diode display differs from a liquid crystal display in that it does not require a separate light source, and has relatively small thickness and weight. Furthermore, as the organic light emitting diode display exhibits high quality characteristics such as low power consumption, high luminance, and a short response time, it is spotlighted as a next generation display device for portable electronic appliances.

Recently, the organic light emitting diode displays have been developed as flexible display devices and stretchable display devices that can be bent or extended by using (or utilizing) a flexible and stretchable material, such as plastics, foil, etc., which can be easily enlarged, are thin, and are lightweight.

However, to realize the above-noted display device, a substrate and a thin film formed thereon must not be weak in terms of bending and elongation. Particularly, when an encapsulation layer for protecting the organic light emitting diode in the case of bending and elongation is damaged, moisture permeates into the damaged portion from the outside. Thus, the organic light emitting diode, which is vulnerable to moisture, is damaged, and its reliability is worsened.

The above information disclosed in this Background section is only for enhancement of understanding of the background of the described technology, and therefore, it may contain information that does not form the prior art that is already known to a person of ordinary skill in the art.

SUMMARY

Aspects of embodiments of the present invention are directed to a flexible and stretchable display device for preventing or reducing decreased reliability of a display device caused by a damaged encapsulation layer, and a manufacturing method thereof.

An example embodiment provides a display device including: a substrate; a plurality of pixels on the substrate; an organic encapsulation layer covering a pixel area including at least one pixel; a first inorganic encapsulation layer on the organic encapsulation layer and having a first crack at a pixel area gap; and a second inorganic encapsulation layer on the first inorganic encapsulation layer and filling the first crack.

The substrate may include a stretchable lower substrate, and a flexible upper substrate on the lower substrate.

A portion of the lower substrate corresponding to the first crack may be elongated more than that of a portion of the lower substrate corresponding to the pixel area.

The portion of the lower substrate corresponding to the pixel area may be elongated to be less than 30% of an elasticity limit of the lower substrate.

A width of the elongated portion of the lower substrate corresponding to the first crack may be greater than twice a thickness of the second inorganic encapsulating layer.

The lower substrate may include polydimethylsiloxane and/or polyurethane.

The upper substrate may include a polyimide.

The first crack may expose the lower substrate, and the second inorganic encapsulation layer may contact the lower substrate.

The pixel area may include the plurality of pixels, and a first gap between neighboring pixels provided in one pixel area may be different from a second gap between neighboring pixels provided in a different pixel area.

The first crack may include a longitudinal crack formed to be stretched in a first planar direction of the substrate, and a transversal crack formed to be stretched in a second planar direction of the substrate crossing the first planar direction.

The second inorganic encapsulation layer may have a second crack that may be narrower than the first crack, and the display device may further include a third inorganic encapsulation layer on the second inorganic encapsulation layer and filling the second crack.

The second inorganic encapsulation layer may cover an edge of the first inorganic encapsulation layer.

The first crack may be formed to be stretchable in a first planar direction of the substrate, and the second crack may be formed to be stretchable in a second planar direction of the substrate crossing the first planar direction.

The pixel may include a thin film transistor on the substrate, and an organic light emitting diode coupled to the thin film transistor.

Another example embodiment provides a display device including: a substrate; a plurality of pixels on the substrate; an organic encapsulation layer covering a pixel area including at least one pixel; and an inorganic encapsulation layer on the organic encapsulation layer in which a first portion corresponding to the pixel area is thicker than a second portion corresponding to a pixel area gap.

The substrate may include a stretchable lower substrate and a flexible upper substrate on the lower substrate.

The lower substrate corresponding to the second portion may be elongated more than that of the lower substrate corresponding to the first portion.

The second portion of the inorganic encapsulation layer may contact the lower substrate.

The lower substrate may include polydimethylsiloxane and/or polyurethane.

Another example embodiment provides a method for manufacturing a display device, the method including: forming a plurality of pixels on a substrate including a stretchable lower substrate and a flexible upper substrate; forming an organic encapsulation layer covering a pixel area including at least one pixel; forming a first inorganic encapsulation layer on the organic encapsulation layer; forming a first crack in the first inorganic encapsulation layer by elongating the lower substrate; and forming a second inorganic encapsulation layer on the first inorganic encapsulation layer to fill the first crack.

The forming of the first crack may include elongating a portion of the lower substrate corresponding to the first crack to be less than 30% of an elasticity limit of the lower substrate.

The forming of the first crack may include forming the first crack to expose the lower substrate.

The lower substrate may include polydimethylsiloxane and/or polyurethane, and the upper substrate may include a polyimide.

When the display device is manufactured according to the example embodiments, damage to the pixel caused by external moisture because of the damaged encapsulation layer is reduced or minimized, and the organic light emitting device with improved reliability is provided.

DETAILED DESCRIPTION

In the drawings and the following detailed description, only certain example embodiments have been shown and described, simply by way of illustration. As those skilled in the art would realize, the described embodiments may be modified in various different ways, all without departing from the spirit or scope of the present invention.

Elements and parts that are unrelated to the description of the example embodiments may have been omitted to make the description clear, and like reference numerals designate like elements throughout the specification.

The size and thickness of each component illustrated in the drawings are arbitrarily illustrated in the drawings for ease of understanding and illustration, but the present invention is not limited to these illustrations.

In the drawings, the thickness of layers, films, panels, regions, etc., are exaggerated for clarity. The thickness of the layers, films, panels, regions, etc., is enlarged in the drawings for ease of understanding and illustration. It will be understood that when an element such as a layer, film, region, or substrate is referred to as being "on" another element, it may be directly on the other element or one or more intervening elements may also be present. It will be understood that when an element or layer is referred to as being "connected to" or "coupled to another element or layer, it can be directly connected to or coupled to the other element or layer, or one or more intervening elements or layers may be present. In contrast, when an element or layer is referred to as being "directly on," "directly connected to," or "directly coupled to" another element or layer, there are no intervening elements or layers present.

In addition, unless explicitly described to the contrary, the word "comprise" and variations such as "comprises" or "comprising" will be understood to imply the inclusion of stated elements, but not the exclusion of any other elements. Throughout this specification, it is understood that the term "on" and similar terms are used generally and are not necessarily related to a gravitational reference.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." The terms "use," "using," and "used" may be considered synonymous with the terms "utilize," "utilizing," and "utilized," respectively.

A display device according to some example embodiments will now be described with reference to the accompanying drawings.

Figure 1:
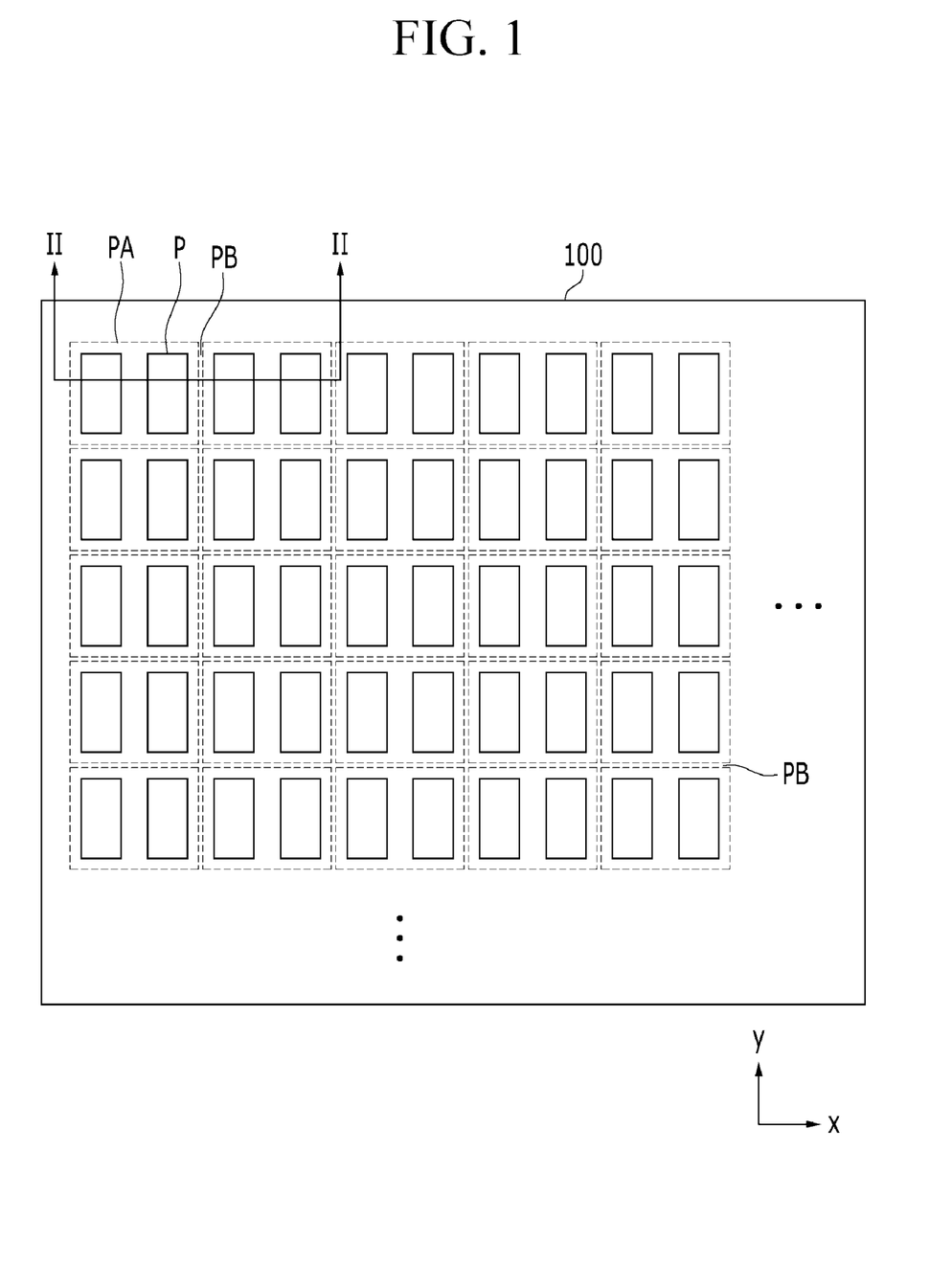
FIG. 1 shows a top plan view of a display device according to some example embodiments.
Figure 2:
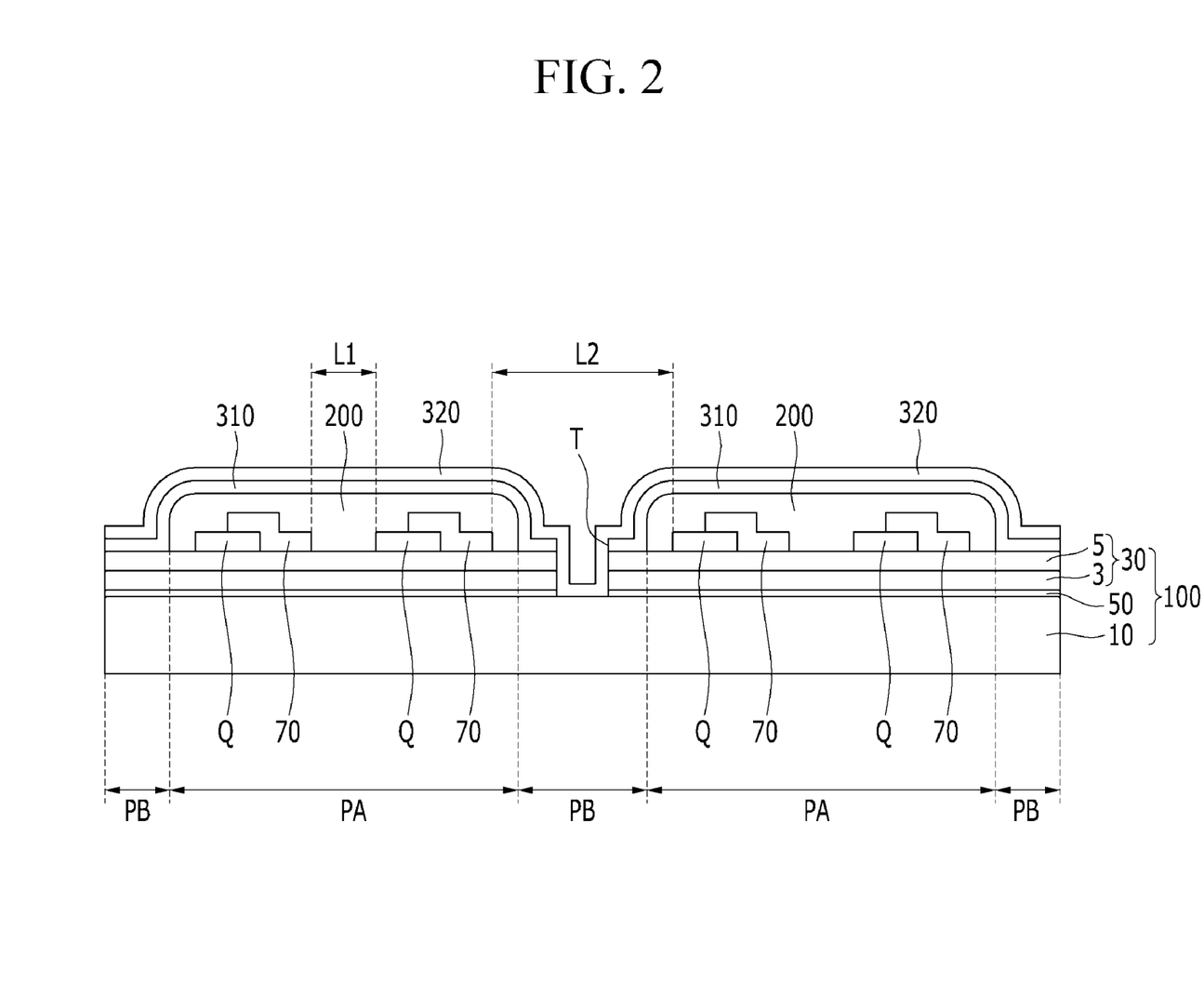
FIG. 2 shows a cross-sectional view along the line II-II shown in FIG. 1.

FIG. 1 shows a top plan view of a display device according to some example embodiments, and FIG. 2 shows a cross-sectional along the line II-II shown in FIG. 1.

As shown in FIG. 1 and FIG. 2, the display device includes a substrate 100, a plurality of pixels (P) formed on the substrate 100, an organic encapsulation layer 200 for covering a pixel area (PA) including at least one pixel (P), a first inorganic encapsulation layer 310 formed on the organic encapsulation layer 200, and a second inorganic encapsulation layer 320 formed on the first inorganic encapsulation layer 310.

The substrate 100 includes a stretchable and elastic lower substrate 10 and a flexible upper substrate 30.

The stretchable and elastic lower substrate 10 may be stretched or shrunk within an elasticity range of the lower substrate 10.

An adhesive layer 50, such as a pressure sensitive adhesive (PSA), is formed between the lower substrate 10 and the upper substrate 30, and the adhesive layer 50 couples (e.g., connects or combines) the lower substrate 10 and the upper substrate 30.

The lower substrate 10 is made of an elastic and stretchable material, for example, the lower substrate 10 may include acryl-based polydimethylsiloxane (PDMS) and/or polyurethane.

The upper substrate 30 is a flexible substrate that can be bent. The upper substrate 30 may be relatively less stretchable than the lower substrate 10, and may have greater thermal resistance than the lower substrate 10.

The upper substrate 30 may include an organic material layer 3 selected from a group including polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), triacetyl cellulose (TAC), cellulose acetate propionate (CAP), or a combination thereof.

The upper substrate 30 may further include an inorganic layer 5 made of a silicon oxide (SiOx) or a silicon nitride (SiNx) at an upper portion or a lower portion of the organic material layer 3, and the organic material layer 3 and the inorganic layer 5 may be repeatedly stacked. When the organic material layer 3 and the inorganic layer 5 are repeatedly stacked, it may be desirable to provide an inorganic layer 5 on a highest layer and a lowest layer (e.g., the outer most layers of the stack).

The pixel includes a thin film transistor Q and emits light to display an image. The pixel may be a pixel of a liquid crystal display or an organic light emitting device. In more detail, a pixel of an organic light emitting device including an equivalent circuit shown in FIG. 3 will now be described.

Figure 3:
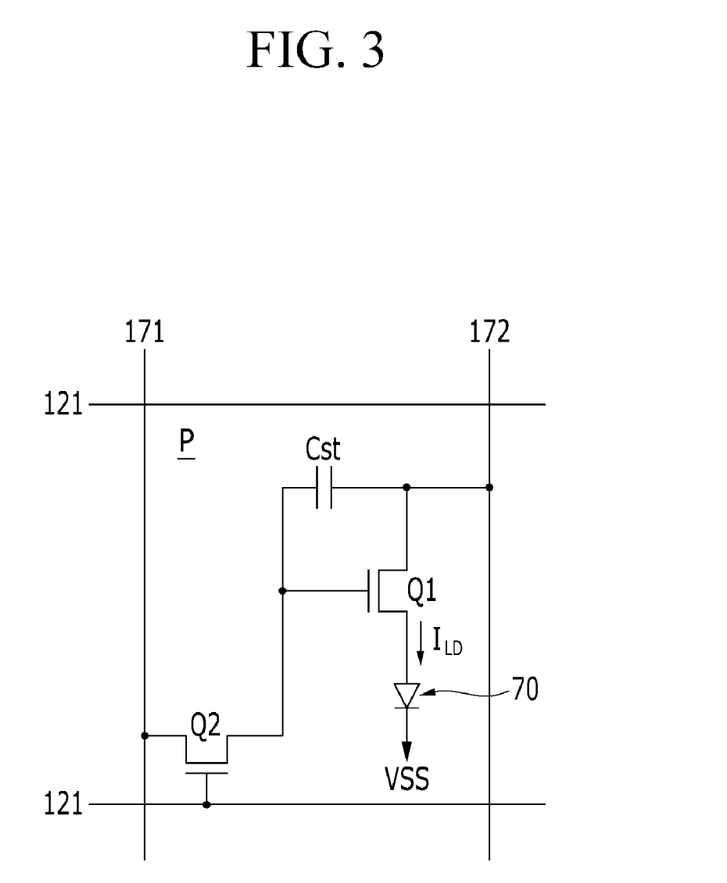
FIG. 3 shows an equivalent circuit diagram of a pixel of a display device according to some example embodiments.

FIG. 3 shows an equivalent circuit diagram of a pixel of a display device according to some example embodiments.

Referring to FIG. 3, the organic light emitting device according to some example embodiments include a plurality of signal lines 121, 171, and 172, and a plurality of pixels (P) coupled (e.g., connected) thereto and substantially arranged in a matrix form.

The signal lines include a plurality of first signal lines 121 for transmitting a gate signal (or a scanning signal), a plurality of second signal lines 171 for transmitting a data signal, and a plurality of third signal lines 172 for transmitting a driving voltage Vdd. The first signal lines 121 are extended substantially in a row direction and are substantially in parallel with each other, and the second signal lines 171 and the third signal lines 172 cross the first signal lines 121 to be extended in a column direction and are substantially in parallel with each other.

Each pixel (P) includes a driving thin film transistor Q1, a switching thin film transistor Q2, a storage capacitor Cst, and an organic light emitting diode (OLED) 70.

The driving thin film transistor Q1 includes a control terminal, an input terminal, and an output terminal, and in more detail, the control terminal is coupled to the switching thin film transistor Q2, the input terminal is coupled to the third signal line 172, and the output terminal is coupled to the organic light emitting diode 70. The driving thin film transistor Q1 supplies an output current ($I_{LD}$) that is variable by a voltage between the control terminal and the output terminal.

The switching thin film transistor Q2 includes a control terminal, an input terminal, and an output terminal, and in more detail, the control terminal is coupled to the first signal line 121, the input terminal is coupled to the second signal line 171, and the output terminal is coupled to the driving thin film transistor Q1. The switching thin film transistor Q2 responds to a scanning signal applied to the first signal line 121, and transmits a data signal applied to the second signal line 171 to the driving thin film transistor Q1.

The storage capacitor Cst is coupled between the control terminal and the input terminal of the driving thin film transistor Q1. The storage capacitor Cst charges the data signal applied to the control terminal of the driving thin film transistor Q1, and maintains the data signal when the switching thin film transistor Q2 is turned off.

The organic light emitting diode 70 includes an anode coupled to the output terminal of the driving thin film transistor Q1, and a cathode coupled to a common voltage Vss. The organic light emitting diode 70 changes intensity according to the output current ($I_{LD}$) of the driving thin film transistor Q1 to emit light for displaying an image.

Figure 4:
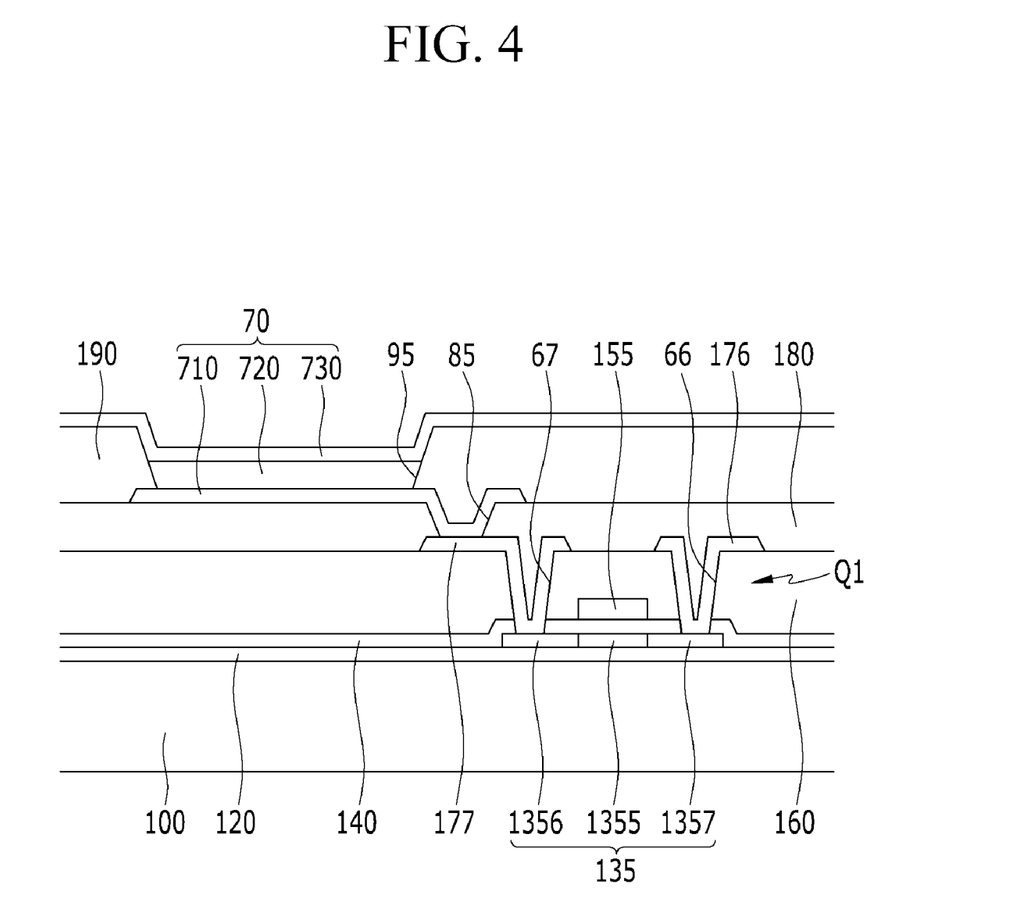
FIG. 4 shows a cross-sectional view of the pixel of the display device shown in FIG. 3.

FIG. 4 shows a cross-sectional view of the pixel of the display device shown in FIG. 3.

The driving thin film transistor Q1 and the organic light emitting diode 70 shown in FIG. 4 will be described in more detail in a stacking order. The driving thin film transistor Q1 will now be referred to as a thin film transistor.

As shown in FIG. 4, the organic light emitting device includes a substrate 100, and a buffer layer 120 is formed on the substrate 100.

The buffer layer 120 may be formed as a single layer of a silicon nitride (SiNx) or a dual-layer structure with a silicon nitride (SiNx) and a silicon oxide ($SiO_x$) stacked. The buffer layer 120 prevents or reduces permeation of unnecessary components such as impurities or moisture, and flattens the surface.

A semiconductor 135 made of polysilicon is formed on the buffer layer 120.

The semiconductor 135 includes a channel region 1355, and a drain region 1356 and a source region 1357 formed on respective sides of the channel region 1355. The channel region 1355 of the semiconductor 135 is polysilicon to which an impurity is not doped, that is, an intrinsic semiconductor. The drain region 1356 and the source region 1357 are polysilicon to which a conductive impurity is doped, that is, impurity semiconductors. The impurity doped to the drain region 1356 and the source region 1357 may be a p-type impurity or an n-type impurity.

A gate insulating layer 140 is formed on the semiconductor 135. The gate insulating layer 140 may be a single layer or multiple layers including at least one of tetraethyl orthosilicate (TEOS), silicon nitride, and silicon oxide.

A gate electrode 155 is formed on the semiconductor 135, and the gate electrode 155 overlaps the channel region 1355.

The gate electrode 155 may be formed with a single layer or multilayers of a low-resistance material such as Al, Ti, Mo, Cu, Ni, or an alloy thereof, or a high-corrosion material.

A first interlayer insulating layer 160 is formed on the gate electrode 155. The first interlayer insulating layer 160 may be formed to be a single layer or multiple layers made of tetraethyl orthosilicate (TEOS), silicon nitride, and/or silicon oxide.

The first interlayer insulating layer 160 and the gate insulating layer 140 include a source contact hole 66 for exposing the source region 1357 and a drain contact hole 67 for exposing the drain region 1356.

A source electrode 176 and a drain electrode 177 are formed on the first interlayer insulating layer 160. The source electrode 176 is coupled (e.g., connected) to the source region 1357 through the contact hole 66, and the drain electrode 177 is coupled to the drain region 1356 through the contact hole 67.

The source electrode 176 and the drain electrode 177 may be formed with a single layer or multilayers of a low-resistance material such as Al, Ti, Mo, Cu, Ni, or an alloy thereof, or a corrosion resistant material. For example, they may be triple layers of Ti/Cu/Ti, Ti/Ag/Ti, or Mo/Al/Mo.

The gate electrode 155, the source electrode 176, and the drain electrode 177 are the control electrode, the input electrode, and the output electrode, respectively, of the driving transistor Q1 as shown in FIG. 3, and configure a thin film transistor with the semiconductor 135. A channel of the thin film transistor is formed on the semiconductor 135 between the source electrode 176 and the drain electrode 177.

A second interlayer insulating layer 180 is formed on the source electrode 176 and the drain electrode 177. The second interlayer insulating layer 180 includes a contact hole 85 for exposing the drain electrode 177.

The second interlayer insulating layer 180 may be formed to be a single layer or multiple layers with tetraethyl orthosilicate (TEOS), a silicon nitride, and/or a silicon oxide, and may be formed with a low dielectric organic material.

A first electrode 710 is formed on the second interlayer insulating layer 180. The first electrode 710 is electrically coupled (e.g., electrically connected) to the drain electrode 177 through the contact hole 85, and the first electrode 710 may be the anode of the organic light emitting diode 70 as shown in FIG. 3.

The second interlayer insulating layer 180 is provided between the first electrode 710 and the drain electrode 177 according to some example embodiments, but the present invention is not limited thereto. For example, the first electrode 710 may be formed on the same layer as the drain electrode 177, and may be integrally formed with the drain electrode 177.

A pixel definition layer 190 is formed on the first electrode 710.

The pixel definition layer 190 includes an opening 95 for exposing the first electrode 710. The pixel definition layer 190 may be formed inclusive of a resin such as a polyacrylate or a polyimide, and a silica-based inorganic material.

An organic emission layer 720 is formed in the opening 95 of the pixel definition layer 190.

The organic emission layer 720 is formed by multiple layers including at least one of an emission layer, a hole injection layer (HIL), a hole transport layer (HTL), an electron transport layer (ETL), and an electron injection layer (EIL).

If the organic emission layer 720 includes all of the above layers, the hole injection layer (HIL) is provided on the first electrode 710 that is the anode, and the hole transport layer (HTL), the emission layer, the electron transport layer (ETL), and the electron injection layer (EIL) are sequentially stacked thereon.

In this instance, the organic emission layer 720 may be formed of a low molecular organic material or a polymeric organic material such as poly(3,4-ethylenedioxythiophene) (PEDOT). The organic emission layer 720 includes a red emission layer to emit red light, a green emission layer to emit green light, and a blue emission layer to emit blue light, wherein the red emission layer, the green emission layer, and the blue emission layer may be formed in a red pixel, a green pixel, and a blue pixel, respectively, to realize color images.

Further, the organic emission layer 720 may be stacked together with the red emission layer, the green emission layer, and the blue emission layer in the red pixel, the green pixel, and the blue pixel to form a red color filter, a green color filter, and a blue color filter, respectively, for each pixel and to implement color images. As another example, a white emission layer to emit white light may be formed in all of the red pixel, the green pixel, and the blue pixel to form the red color filter, the green color filter, and the blue color filter for each pixel, respectively, and to implement the color images. If the color image is implemented using the white emission layer and the color filter, the red emission layer, the green emission layer, and the blue emission layer are not required to use a deposition mask to be deposited for each pixel, that is, the red pixel, the green pixel, and the blue pixel.

In addition, the white emission layer may be formed of one emission layer for emitting white light, and the white light may be emitted by stacking emission layers for emitting different colors of light. For example, a configuration to emit the white light by combining at least one yellow emission layer and at least one blue emission layer, a configuration to emit the white light by combining at least one cyan emission layer and at least one red emission layer, and a configuration to emit the white light by combining at least one magenta emission layer and at least one green emission layer may also be included.

A second electrode 730, that is the cathode shown in FIG. 3, is formed on the pixel definition layer 190 and the organic emission layer 720.

The first electrode 710, the organic emission layer 720, and the second electrode 730 form the organic light emitting diode 70.

The organic light emitting diode (OLED) display may be a front display type, a rear display type, or a both-side display type according to a direction in which the organic light emitting diode 70 emits light.

In the case of the front display type (front display), the first electrode 710 is formed to be a reflective layer and the second electrode 730 is formed to be a semi-reflective layer or a transmissive layer. In the case of the rear display type (rear display), the first electrode 710 is formed to be a semi-transmissive layer and the second electrode 730 is formed to be a reflective layer. In the case of the both-side display type (both-side display), the first electrode 710 and the second electrode 730 are formed to be transparent layers or semi-transmissive layer.

The reflective layer and the semi-transmissive layer are made of at least one metal of magnesium (Mg), silver (Ag), gold (Au), calcium (Ca), lithium (Li), chromium (Cr), and aluminum (Al), or an alloy thereof. The reflective layer and the semi-transmissive layer are determined by thickness, and the semi-transmissive layer may be formed to be less than 200 nm thick. Optical transmittance is increased when the thickness is reduced, but when it is too thin, resistance is increased.

The transparent layer is made of indium tin oxide (ITO), indium zinc oxide (IZO), zinc oxide (ZnO) and/or indium oxide ($In_2O_3$).

Referring to FIG. 1 and FIG. 2, the substrate 100 may be divided into a plurality of pixel areas (PA). The pixel areas (PA) may be divided to include a same number of pixels on the same substrate, and may be divided to be regularly arranged.

The organic encapsulation layer 200 is formed to cover each pixel area (PA) including a thin film transistor Q and an organic light emitting diode 70. The pixel area (PA) is divided to include two pixels (P) in FIG. 1, but the present invention is not limited thereto, and it may also be divided to include one pixel or include at least three pixels.

The organic encapsulation layer 200 includes polymers, and may be a single layer or multiple layers formed with at least one of a polyethylene terephthalate, a polyimide, a polycarbonate, an epoxy, a polyethylene, and a polyacrylate. Further, the organic encapsulation layer may be formed with a polyacrylate, and in more detail, it may include a polymerized monomer composition including a di-acrylate monomer and a tri-acrylate monomer. A mono-acrylate monomer may be included in the monomer composition. Also, a photoinitiator such as TPO may be further included in the monomer composition, but the present invention is not limited thereto.

The organic encapsulation layer 200 is shown as being directly on the organic light emitting diode 70 in FIG. 2, but the present invention is not limited thereto, and for example, a capping layer for protecting the second electrode of the organic light emitting diode 70, or a functional layer of LiF for increasing photo-efficiency of the organic light emitting diode 70 may be further formed therebetween.

The first inorganic encapsulation layer 310 is formed on the organic encapsulation layer 200 to cover an edge of the organic encapsulation layer 200.

The first inorganic encapsulation layer 310 may be a single layer or multiple layers including a metal oxide or a metal nitride. For example, the first inorganic encapsulation layer 310 may include at least one of SiNx, $Al_2O_3$, $SiO_2$, and $TiO_2$.

The first inorganic encapsulation layer 310 has a crack (T), which is provided in a region that corresponds to a pixel area gap (PB). The crack (T) may be formed along the X axis and the Y axis to cross them, and if desired, it may be formed along the X axis or the Y axis (see also FIG. 1).

A first gap L1 between pixels in one pixel area (PA) may be different from a second gap L2 between two neighboring pixels that are provided to a different pixel area. The crack (T) is generated in the pixel area gap (PB) to separate a distance between the two neighboring pixels by the crack (T) so the second gap L2 may be different from the first gap L1, and the second gap L2 may be greater than the first gap L1 by more than the crack (T).

The first gap L1 and the second gap L2 are distances that are measured by coupling (e.g., connecting) a gap between the same points, for example, a distance between first electrodes of the organic light emitting diode of the pixel, a distance between signal lines coupled (e.g., connected) to the thin film transistor, or a distance between the first electrode of the organic light emitting diode and the signal line coupled to the thin film transistor.

The second inorganic encapsulation layer 320 is formed on the first inorganic encapsulation layer 310 to fill the crack (T) of the first inorganic encapsulation layer 310. In this instance, the crack (T) may be formed on the upper substrate 30 as well as the first inorganic encapsulation layer 310, so that the second inorganic encapsulation layer 320 may contact the lower substrate 10.

The second inorganic encapsulation layer 320 may be formed with the same or substantially the same material as the first inorganic encapsulation layer 310. The second inorganic encapsulation layer 320 may be formed with an inorganic material that is different from that of the first inorganic encapsulation layer 310, and it may be formed with the same or substantially the same material in consideration of a close contacting property and ease of a process.

As described, when the first inorganic encapsulation layer and the second inorganic encapsulation layer are formed with a same or substantially the same material, the first inorganic encapsulation layer and the second inorganic encapsulation layer are formed in the pixel area (PA), and the second inorganic encapsulation layer is formed in the region that corresponds to the crack (T), so the inorganic encapsulation layer provided in the pixel area (PA) is formed to be thicker than the inorganic encapsulation layer provided in the region that corresponds to the crack (T).

According to some example embodiments, when the crack is formed in the first inorganic encapsulation layer according to an elongation process and the second inorganic encapsulation layer is formed to fill the crack, in the case in which a new crack is generated because of stretching or bending of the display device, a path for external moisture to be transmitted to the pixel by the new crack is increased, so the damage of the organic light emitting diode of the pixel by external moisture may be minimized or reduced.

Figure 5:
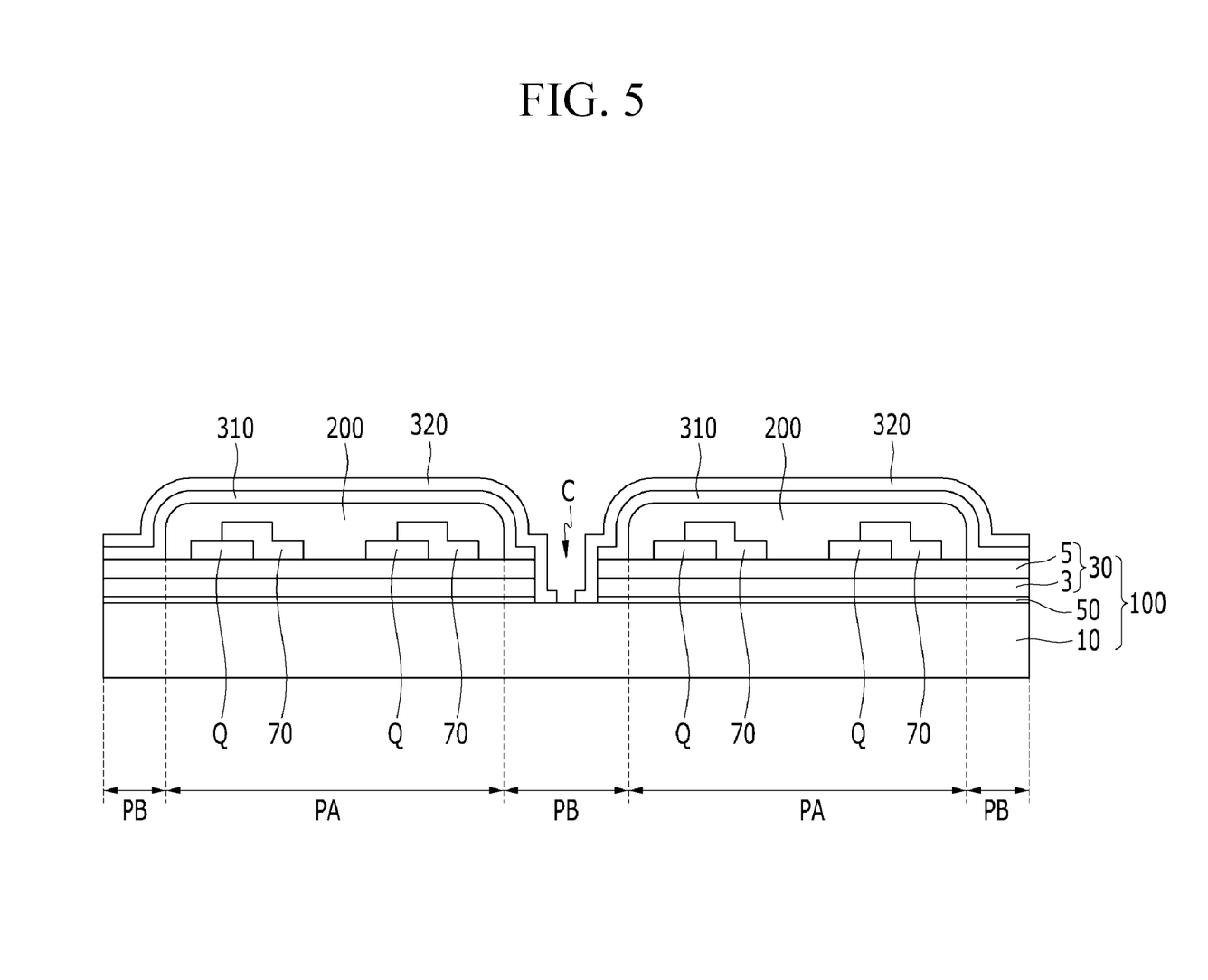
FIG. 5 shows a cross-sectional view of a display device having a portion that is cracked according to some example embodiments.

FIG. 5 shows a cross-sectional view of a display device of which a portion is cracked according to some example embodiments.

As shown in FIG. 5, when the display device is bent or stretched, a permeation crack (C) into which external moisture may permeate may occur. That is, the permeation crack is generated when the second inorganic encapsulation layer that is an inorganic encapsulation layer provided to the outermost side is broken, so that it provides a path through which external moisture is penetrated.

In this instance, regarding the display device according to some example embodiments, the permeation crack (C) is formed in the pixel area gap (PB).

Since the permeation crack (C) occurs in the pixel area gap (PB), the organic encapsulation layer, the first inorganic encapsulation layer, and the second inorganic encapsulation layer provided in the pixel area (PA) are not damaged. That is, when the permeation crack (C) is generated, the organic encapsulation layer covers the pixel, the organic encapsulation layer is covered along the edge with the first inorganic encapsulation layer, and the first inorganic encapsulation layer is covered along the edge with the second inorganic encapsulation layer.

Therefore, the pixel is completely or substantially sealed by the organic encapsulation layer, the first inorganic encapsulation layer, and the second inorganic encapsulation layer, thereby preventing the pixel from being damaged because of external moisture.

A method of manufacturing the display device shown in FIG. 1 and FIG. 2 will be described in more detail with reference to FIG. 2 and FIG. 6 to FIG. 11.

Figure 8:
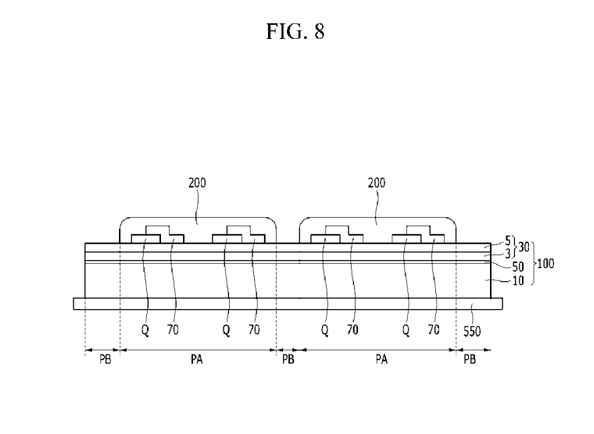
Figure 9:
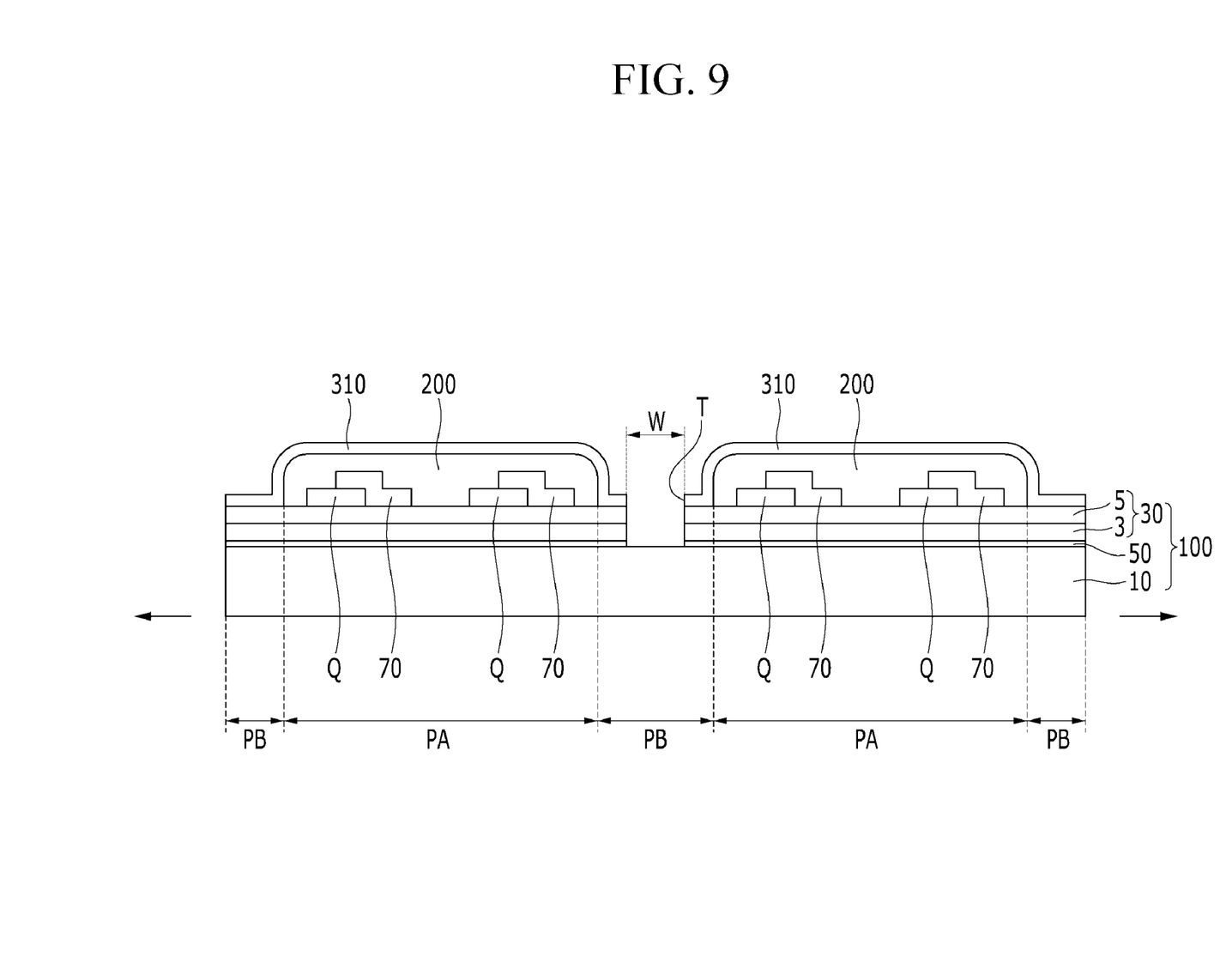
Figure 10:
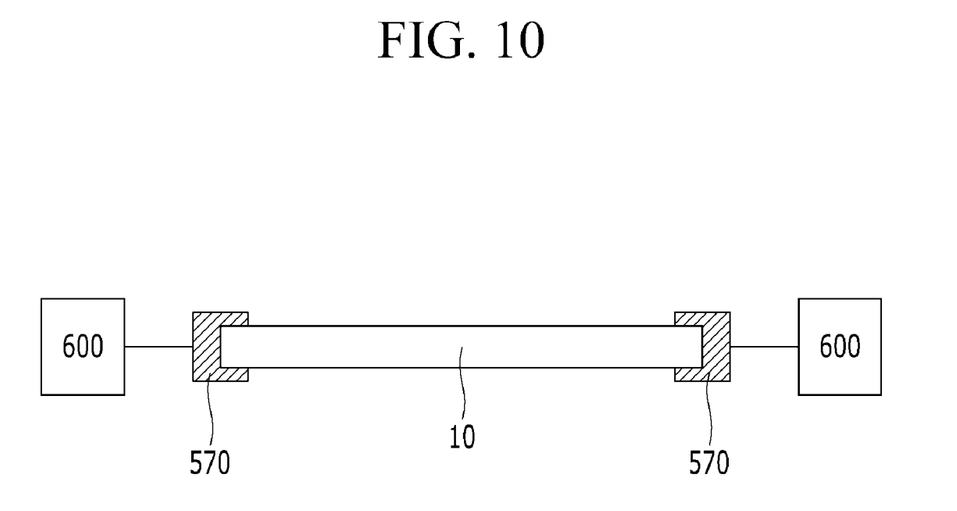
FIG. 10 and FIG. 11 show a method for elongating a substrate according to some example embodiments.
Figure 11:
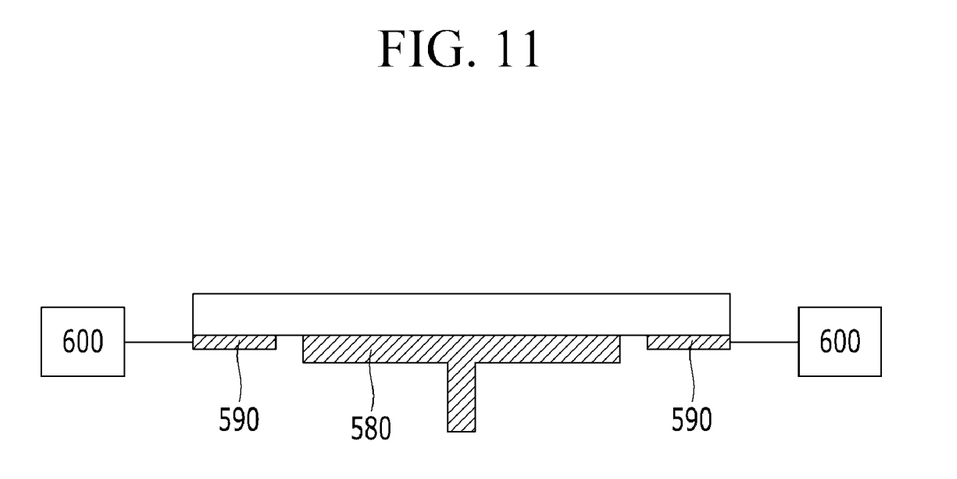

FIG. 6 to FIG. 9 show cross-sectional views of a method for manufacturing a display device according to some example embodiments, and FIG. 10 and FIG. 11 show a method for elongating a substrate according to some example embodiments.

Figure 6:
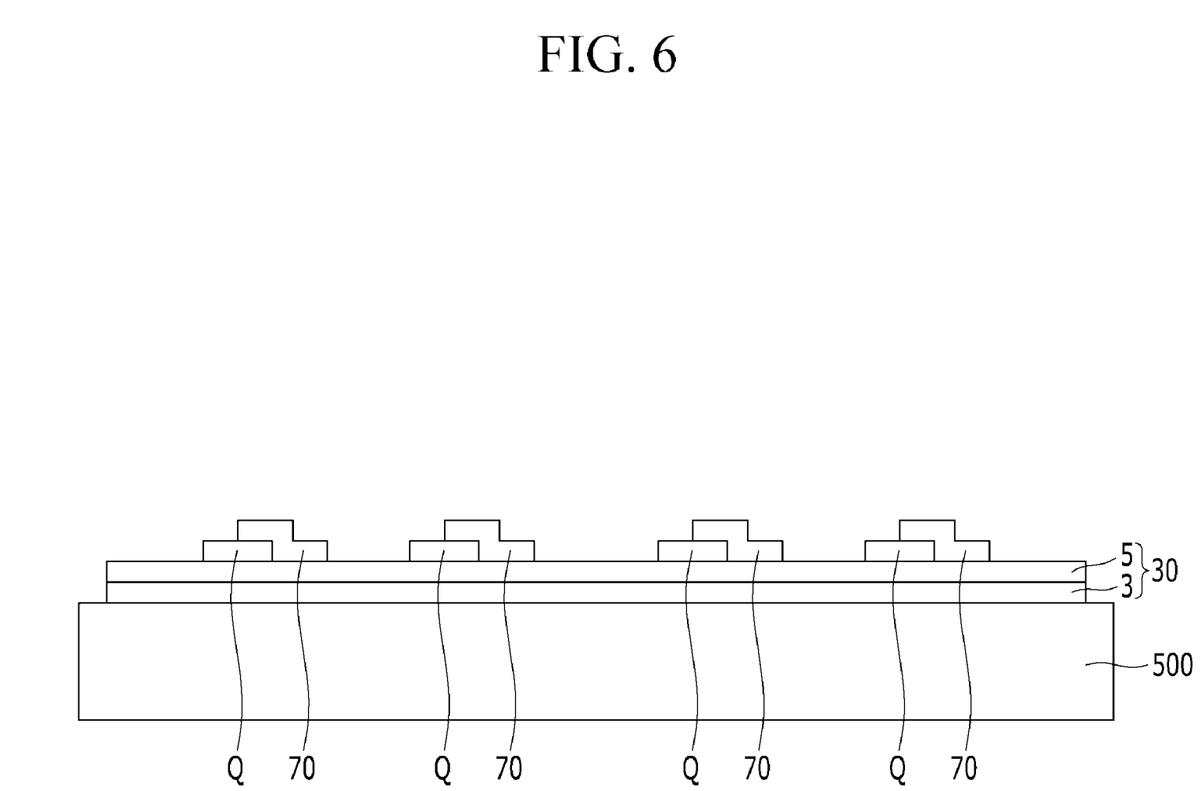
FIG. 6 to FIG. 9 show cross-sectional views of a method for manufacturing a display device according to some example embodiments.

As shown in FIG. 6, an upper substrate 30 is formed on a first support substrate 500. The first support substrate 500 supports the upper substrate 30 and is made of glass, metal, or ceramic.

The upper substrate 30 is formed of an organic material layer 3 with a polyimide and/or an inorganic layer 5 with a $SiO_x$, $SiN_y$, or $SiO_xN_y$.

The organic material layer 3 may be formed by coating the polyimide as a liquid and hardening it, and if desired, it may be formed to be multiple layers by repeatedly coating and hardening the polyimide. The organic material layer 3 may be coated on the first support substrate 500 according to a spin coating, a slit coating, and/or an inkjet coating process. The inorganic layer 5 may be formed according to a chemical vapor deposition method.

The organic material layer 3 and the inorganic layer 5 have been respectively shown to be single layers in FIG. 6, but at least one of the organic material layer 3 and the inorganic layer 5 may be formed to be multiple layers, and the organic material layer 3 and the inorganic layer 5 may be alternately and repeatedly stacked.

A pixel including a thin film transistor Q and an organic light emitting diode 70 having the inter-layer structure shown in FIG. 3 and FIG. 4 is formed on the upper substrate 30.

Figure 7:
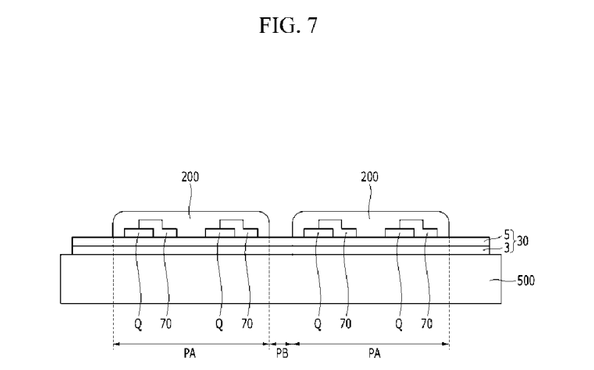

As shown in FIG. 7, an organic encapsulation layer 200 is formed on the pixel to seal the thin film transistor Q and the organic light emitting diode 70. In this instance, the organic encapsulation layer 200 is formed for each pixel area (PA) to cover two pixels shown in FIG. 6.

The organic encapsulation layer 200 may be formed according to an inkjet printing method, or it may be formed in the pixel area (PA) by forming the pixel area (PA) and the pixel area gap (PB) to have different characteristics, such as, for example, to be hydrophilic and hydrophobic, respectively, and performing a slit coating process.

As shown in FIG. 8, the first support substrate is separated from the upper substrate 30, and a lower substrate 10 is attached thereto.

The lower substrate 10 is formed by coating a PDMS or a PU on a second support substrate 550 and hardening it, and the upper substrate 30 is attached to the lower substrate 10 by using (or utilizing) an adhesive layer 50.

In this instance, a protection film may be attached to the organic encapsulation layer 200 to prevent or reduce a surface of the organic encapsulation layer 200 from being exposed to the outside or from being damaged when it moves.

As shown in FIG. 9, the protection film and the second support substrate 550 are removed, and the substrate 100 on which the organic encapsulation layer 200 is formed is mounted in a chamber of a chemical vapor deposition device.

A first inorganic encapsulation layer 310 is formed on the organic encapsulation layer 200. The first inorganic encapsulation layer 310 may be made of $Al_2O_3$.

The lower substrate 10 is elongated for a first time in a first direction. When the lower substrate 10 is elongated, a crack (T) occurs in the first inorganic encapsulation layer 310, which is relatively poor at stretching. In this instance, the crack (T) is formed between the organic encapsulation layer 200 of one pixel area PA and the organic encapsulation layer 200 of another pixel area PA, that is, in the pixel area gap (PB).

The lower substrate 10 is elongated for a second time in a direction that crosses the first elongation direction to form a crack that crosses the crack (T) generated by the first elongation.

The lower substrate 10 is elongated by less than 30% (e.g., greater than 0% and less than 30%) of an elasticity limit of the lower substrate 10, and in this case, it may be desirable for a width (W) of the crack (T) formed in the first inorganic encapsulation layer 310 to be greater than twice the thickness of the second inorganic encapsulation layer 320. For example, when the second inorganic encapsulation layer 320 is formed to be 0.7 μm thick, it may be desirable to form the width (W) of the crack to be greater than 1.4 μm.

If the lower substrate 10 is elongated by greater than 30% of an elasticity limit of the lower substrate 10, a margin for bending or stretching it is reduced when the display device is used, so it may not be easy to substantially use (or utilize) it as a flexible display device and a stretchable display device.

The lower substrate 10 may be elongated by using a jig or a chuck. In more detail, as shown in FIG. 10, according to some embodiments, the jig 570 coupled (e.g., connected) to a driver 600 is combined to an edge of the lower substrate 10, and the jig 570 is pulled by using (or utilizing) the driver 600, thereby elongating the lower substrate 10.

As shown in FIG. 11, according to some embodiments, the lower substrate 10 is mounted on a fixing chuck 580 and a driving chuck 590. In this instance, the lower substrate 10 is not attached or combined to the fixing chuck 580 but is placed on the fixing chuck 580, whereas the edge of the lower substrate 10 may be fixed to the driving chuck 590 through vacuum absorption.

Therefore, when the driving chuck 590 is moved, the lower substrate 10 is stretched together with a movement of the driving chuck 590 and is then elongated.

The crack (T) is shown in FIG. 9 to be generated to reach the upper substrate 30, and when it is elongated by using (or utilizing) a roll, a curvature radius of the first inorganic encapsulation layer 310 that is relatively distant from the upper substrate 30 is great so the crack may be generated to the first inorganic encapsulation layer 310.

As shown in FIG. 2, a second inorganic encapsulation layer 320 is formed to fill the crack (T) of the first inorganic encapsulation layer 310.

To ease the process without a reduction of a close contacting property and replacement of a deposition material with the first inorganic encapsulation layer 310, it may be desirable to form the second inorganic encapsulation layer 320 with the same or substantially the same material as the first inorganic encapsulation layer 310.

The second inorganic encapsulation layer 320 has been described to be formed after the first elongation and the second elongation in the above-described example embodiments, but the present invention is not limited thereto. For example, it may be possible to form the second inorganic encapsulation layer after the first elongation and then additionally form a third inorganic encapsulation layer after the second elongation.

Figure 12:
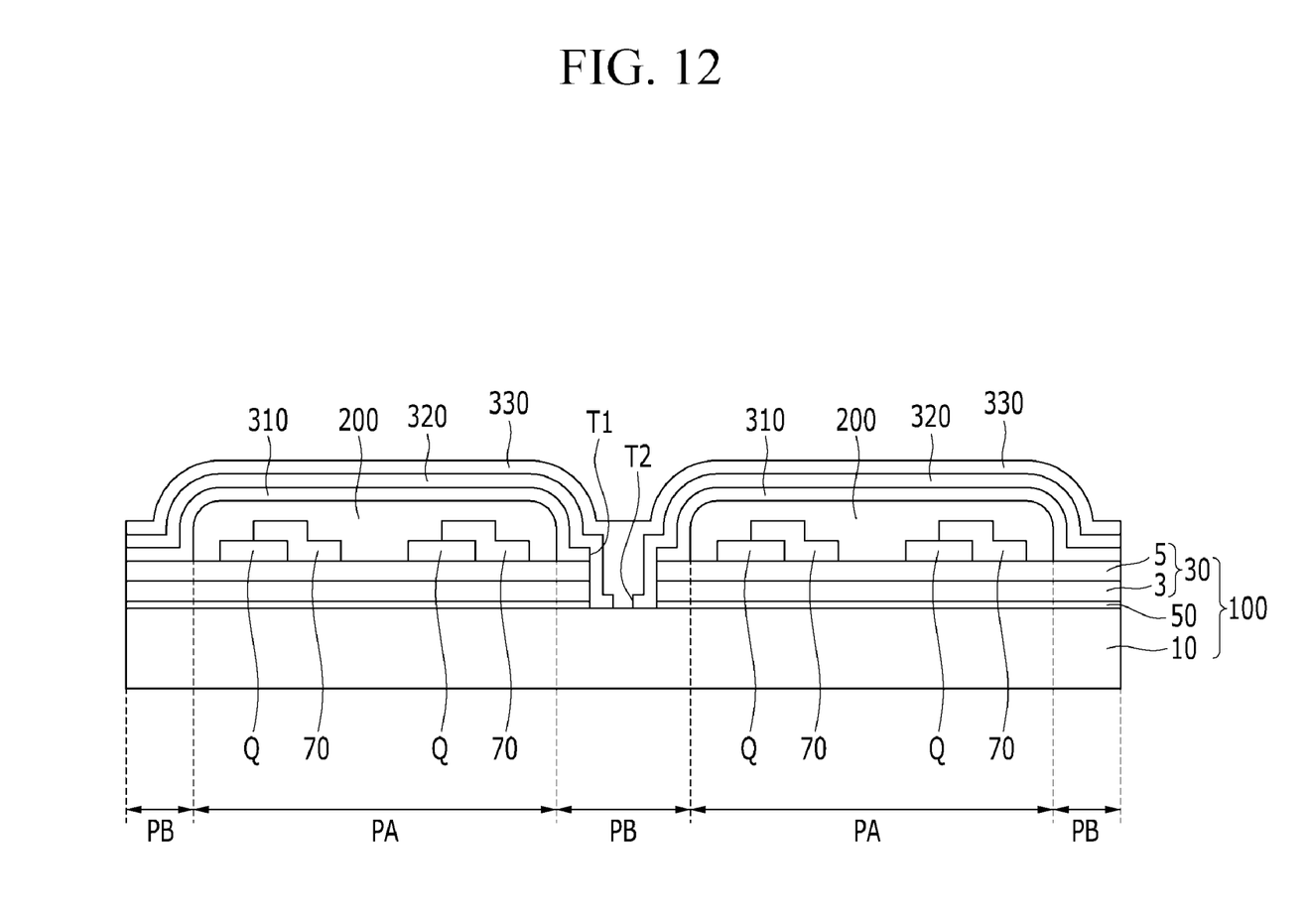
FIG. 12 shows a cross-sectional view of a display device according to some example embodiments.

FIG. 12 shows a cross-sectional view of a display device according to some example embodiments.

Most of the inter-layer structure of the display device shown in FIG. 12 corresponds to that of the display device described with reference to FIG. 1 and FIG. 2, so repeat description thereof may be omitted.

The display device shown in FIG. 12 includes a substrate 100, a plurality of pixels (P) formed on the substrate 100, an organic encapsulation layer 200 for covering a pixel area (PA) including at least one pixel, a first inorganic encapsulation layer 310 formed on the organic encapsulation layer 200, and a second inorganic encapsulation layer 320 formed on the first inorganic encapsulation layer 310.

The first inorganic encapsulation layer 310 has a first crack T1 provided in a pixel area gap (PB). The second inorganic encapsulation layer 320 has a second crack T2 that covers an edge of the first inorganic encapsulation layer 310 for forming the first crack T1 and that is narrower than the first crack T1.

A third inorganic encapsulation layer 330 for filling the second crack T2 is formed on the second inorganic encapsulation layer 320. The third inorganic encapsulation layer 330 may be formed to fill the crack after elongating the second inorganic encapsulation layer 320 as shown in FIG. 8.

In this instance, to form the third inorganic encapsulation layer 330, when the elongation process such as elongating the first inorganic encapsulation layer and then elongating the second inorganic encapsulation layer is repeated, it may be desirable to establish a maximum width of the crack induced by the elongation process to be less than 30% of the elasticity limit of the lower substrate.

Therefore, the maximum width may be set to be less than 30% thereof in consideration of a number of times of stacking the inorganic encapsulation layer to be formed. For example, in the case of forming the layers up to the third inorganic encapsulation layer, when the first inorganic encapsulation layer is formed, it is elongated less than 15% to form a crack, when the second inorganic encapsulation layer is formed, it is elongated less than 15% to form a crack, and when the third inorganic encapsulation layer is formed, the maximum elongated width becomes less than 30%.

When the third inorganic encapsulation layer as described is provided, the path for the external moisture to permeate into the pixel is further increased compared to the case of forming the second inorganic encapsulation layer to prevent or protect the pixel from being damaged by moisture and reliability of the display device from being deteriorated.

Although not shown, an additional inorganic encapsulation layer may be formed by forming a crack in the third inorganic encapsulation layer 330 through elongation and forming an inorganic encapsulation layer to fill the crack.

While this disclosure has been described in connection with what is considered to be practical example embodiments, it is to be understood that the invention is not limited to the disclosed embodiments, but on the contrary, is intended to cover various modifications and equivalent arrangements included within the spirit and scope of the appended claims, and their equivalents.

What is claimed is:

1. A display device comprising:
a substrate comprising a plurality of pixel areas including a first pixel area comprising at least two pixels, wherein the substrate comprises a stretchable lower substrate and a flexible upper substrate on the lower substrate;
an organic encapsulation layer covering the at least two pixels of the first pixel area on the flexible upper substrate;
a first inorganic encapsulation layer on the organic encapsulation layer and having a first crack at a pixel area gap between corresponding pixel areas of the plurality of pixel areas, the first crack corresponding to a stretched portion of the substrate at the pixel area gap; and
a second inorganic encapsulation layer on the first inorganic encapsulation layer and covering the first crack between the corresponding pixel areas,
wherein the flexible upper substrate has the first crack, and
wherein a side surface of the flexible upper substrate at the first crack and a side surface of the first inorganic encapsulation layer at the first crack overlap with each other.

2. The display device of claim 1, wherein a portion of the lower substrate corresponding to the first crack is elongated more than that of a portion of the lower substrate corresponding to the first pixel area.

3. The display device of claim 2, wherein the portion of the lower substrate corresponding to the first pixel area is elongated to be less than 30% of an elasticity limit of the lower substrate.

4. The display device of claim 2, wherein
a width of the elongated portion of the lower substrate corresponding to the first crack is greater than twice a thickness of the second inorganic encapsulating layer.

5. The display device of claim 1, wherein
the lower substrate comprises polydimethylsiloxane and/or polyurethane.

6. The display device of claim 5, wherein
the upper substrate comprises a polyimide.

7. The display device of claim 1, wherein
the first crack exposes the lower substrate, and
the second inorganic encapsulation layer contacts the lower substrate.

8. The display device of claim 1, wherein
each of the pixel areas comprise a plurality of pixels, and
a first gap between neighboring pixels provided in one pixel area is different from a second gap between neighboring pixels provided in a different pixel area.

9. The display device of claim 1, wherein the first crack includes:
a longitudinal crack formed to be stretched in a first planar direction of the substrate, and
a transversal crack formed to be stretched in a second planar direction of the substrate crossing the first planar direction.

10. The display device of claim 1, wherein
the second inorganic encapsulation layer has a second crack that is narrower than the first crack, and
the display device further comprises a third inorganic encapsulation layer on the second inorganic encapsulation layer and filling the second crack.

11. The display device of claim 10, wherein
the second inorganic encapsulation layer covers an edge of the first inorganic encapsulation layer.

12. The display device of claim 10, wherein
the first crack is formed to be stretchable in a first planar direction of the substrate, and
the second crack is formed to be stretchable in a second planar direction of the substrate crossing the first planar direction.

13. The display device of claim 1, wherein
the at least two pixels of the first pixel area each comprise:
a thin film transistor on the substrate, and
an organic light emitting diode coupled to the thin film transistor.

14. A display device comprising:
a substrate comprising a plurality of pixel areas, including a first pixel area comprising at least two pixels, wherein the substrate comprises a stretchable lower substrate and a flexible upper substrate on the lower substrate, and a pixel area gap is disposed between neighboring pixel areas;
an organic encapsulation layer covering the at least two pixels of the first pixel area on the flexible upper substrate; and
an inorganic encapsulation layer on the organic encapsulation layer in which a first portion covering the at least two pixels is thicker than a second portion covering the pixel area gap, the inorganic encapsulation layer having a first crack corresponding to a stretched portion of the substrate at the pixel area gap,
wherein the flexible upper substrate has the first crack, and
wherein a side surface of the flexible upper substrate at the first crack and a side surface of the inorganic encapsulation layer at the first crack overlap with each other.

15. The display device of claim 14, wherein
a portion of the lower substrate corresponding to the pixel area gap is elongated more than that of a portion of the lower substrate corresponding to the first pixel area.

16. The display device of claim 14, wherein
the second portion of the inorganic encapsulation layer contacts the lower substrate.

17. The display device of claim 14, wherein the lower substrate comprises polydimethylsiloxane and/or polyurethane.

* * * * *